United States Patent
Wakefield et al.

(10) Patent No.: US 10,073,932 B2
(45) Date of Patent: Sep. 11, 2018

(54) CAPTURING TIME-SLICE OF EMULATION DATA FOR OFFLINE EMBEDDED SOFTWARE DEBUG

(71) Applicant: Synopsys, Inc., Mountain View, CA (US)

(72) Inventors: Alexander John Wakefield, Fort Lauderdale, FL (US); Jefferry Phuong Vo, Portland, OR (US); Joerg Horst Richter, Herzogenrath (DE); Kai Thorsten Schuetz, Aachen (DE)

(73) Assignee: Synopsys, Inc., Mountain View, CA (US)

( * ) Notice: Subject to any disclaimer, the term of this patent is extended or adjusted under 35 U.S.C. 154(b) by 19 days.

(21) Appl. No.: 15/449,877

(22) Filed: Mar. 3, 2017

(65) Prior Publication Data
US 2017/0255728 A1     Sep. 7, 2017

Related U.S. Application Data

(60) Provisional application No. 62/304,044, filed on Mar. 4, 2016.

(51) Int. Cl.
*G06F 17/50*     (2006.01)

(52) U.S. Cl.
CPC ...... *G06F 17/5027* (2013.01); *G06F 17/5031* (2013.01)

(58) Field of Classification Search
CPC .................................................. G06F 17/5068
USPC ......................................................... 716/106
See application file for complete search history.

(56) References Cited

U.S. PATENT DOCUMENTS

| 7,472,054 B2 * | 12/2008 | Garcia | G06F 17/5022 703/14 |
| 2004/0249623 A1 * | 12/2004 | Selvidge | G06F 17/5027 703/23 |
| 2007/0266348 A1 * | 11/2007 | Yoshikawa | G06F 17/5031 716/103 |
| 2013/0055181 A1 * | 2/2013 | Suzuki | G06F 17/5027 716/106 |

* cited by examiner

*Primary Examiner* — Suresh Memula
(74) *Attorney, Agent, or Firm* — Fenwick & West LLP

(57) ABSTRACT

Disclosed is a method (or a system or a non-transitory computer readable medium) for recreating states of an embedded processing unit of a design under test (DUT). In one aspect, a host system configures an emulator to implement the DUT. The DUT includes the embedded processing unit and a memory unit. The host system configures the emulator to execute design instructions for testing an operation of the DUT through the embedded processing unit. The host system receives a stream of values stored by the memory unit of the DUT. The values indicate execution results of the design instructions executed by the embedded processing unit. The host system stores the stream of the values and generates a log file for recreating one or more states of the embedded processing unit based on the stored stream of the values.

18 Claims, 7 Drawing Sheets

CAPTURING TIME-SLICE OF EMULATION DATA FOR OFFLINE EMBEDDED SOFTWARE DEBUG

CROSS-REFERENCE TO RELATED APPLICATION

This application claims the benefit of U.S. Provisional Application No. 62/304,044, entitled "CAPTURING TIME-SLICE OF EMULATION DATA FOR OFFLINE EMBEDDED SOFTWARE DEBUG," filed Mar. 4, 2016, which is incorporated by reference herein in its entirety.

FIELD

The disclosure generally relates to the emulation of circuits, and more specifically to obtaining emulation results.

BACKGROUND

Emulators have been developed to assist circuit designers in designing and debugging highly complex integrated circuits. An emulator includes hardware that imitates the operations of a circuit under test (also referred to as a design under test (DUT)). By using an emulator to imitate the operations of a DUT, designers can verify that a DUT complies with various design requirements prior to a fabrication.

IC designs are typically described in a HDL language such as Verilog or VHDL. Software can execute on an embedded processor inside the HDL design and the processor execution state can be logged to a file during the model execution. Existing tools can take this software log or database and provide a post-process debug capability that allows the verification engineer to step forward and/or backwards through the recorded embedded software execution.

Post process debug solutions include the processor-state to be recreated at any point in time. The debugger analyzes the following items: program counter, status registers, processor registers, and memory read/write transactions.

The processor execution log generated through emulation is difficult to analyze. The processor execution log typically contains a time-stamp, program counter, register values and all embedded processor to cache memory read/write transactions. In one aspect, the amount of processor execution log can exceed, for example, over 5 Gigabytes, and processing this large log is not feasible or efficient in a post-process debug tool. In another aspect, the memory state stored in the emulator includes multiple cache levels, SoC-interconnect, and memory-controller, and address/data values for any memory item stored by emulator is heavily design dependent. For these reasons, the processor's view of memory cannot be easily extracted from the emulation system.

Therefore, conventional emulation environment is inefficient in terms of hardware and communication resources employed for debugging operations of an embedded processor of a DUT.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
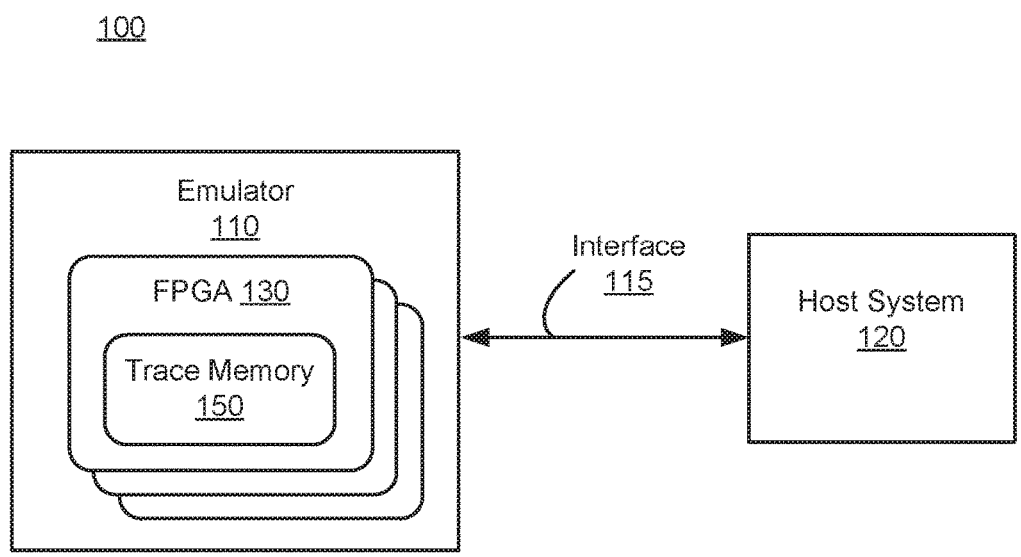
FIG. 1 is a block diagram of an emulation environment, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

The figures use like reference numerals to identify like elements. A letter after a reference numeral, such as "230A," indicates that the text refers specifically to the element having that particular reference numeral. A reference numeral in the text without a following letter, such as "230," refers to any or all of the elements in the figures bearing that reference numeral.

Configuration Overview

Disclosed is a method to efficiently save the state of one or more embedded processors during the execution of the embedded software, and then allow a time-slice of the code execution to be debugged offline using a post-process methodology. An embedded processor herein refers to a processing unit in a part of a design under test (DUT).

In one or more embodiments, memory read/write transactions that occur during the emulation execution are captured. In one example, an embedded processor (e.g., a central processing unit) of a DUT executes one or more design instructions for verifying a performance and/or functionality of the DUT. Values of execution results of the embedded processor are sent to a host system that is communicatively coupled to the emulator. The host system includes a memory mirror for storing the values of execution results of the embedded processor. The memory mirror herein refers to a storage unit for storing values of execution results of the embedded processor. In one aspect, the memory mirror does not contain any cache, interconnect or other design specific implementation. Advantageously, a state of the embedded processor execution of the design instructions can be re-created by the host system at any time window, by use of the memory mirror.

Emulation refers to imitating the behavior of an electronic design with configurable hardware components. An emulation model may be based on a hardware description language, e.g., Verilog, which may be compiled into a format used by an emulation system. Emulation may be used to assist with functional verification of a design under test.

A logic gate (or a logic circuit) refers to a combinatorial logic gate, a sequential logic gate or any circuitry. A portion of the logic gates simulated can be a part of the DUT emulated by the emulator, or an additional circuitry to test a certain condition of the DUT (e.g., error detection or power analysis) that is not part of the DUT.

A signal refers to, but is not limited to, a net, a wire, a variable, a port, or an element of a design having a value carried, monitored or traced.

Emulation Environment

FIG. 1 is a block diagram illustrating an emulation environment 100 (also referred to as an "emulation system" or "emulation environment system 100"), according to one example embodiment. The emulation environment 100 includes an emulator 110 and a host system 120. The emulator 110 and the host system 120 communicate through an interface 115.

The interface 115 is a communication medium that allows communication between the host system 120 and the emulator 110. In one embodiment, the interface 115 is one or more cables with electrical connections. For example, the interface 115 may be one or more USB, LAN, optical, IEEE 1394 (FireWire), or custom built cables. In other embodiment, the interface 115 is a wireless communication medium or a network with one or more points of access. For another example, the interface 115 may be a wireless communication medium employing a Bluetooth® or IEEE 802.11 protocol. In one embodiment, the interface 115 is enabled during the operation of the host system 120 and the emulator 110. In one embodiment, the interface 115 is only enabled when the host system 120 and the emulator 110 need to exchange information with each other.

The emulator 110 is a hardware system that emulates designs under test (DUTs). A DUT includes one or more circuit designs. The DUT emulated can be either combinatorial, sequential, or a combination of both. The emulator 110 includes multiple field-programmable gate arrays (FPGAs) 130 that can be configured to emulate a DUT. Each FPGA 130 includes a trace memory 150 (e.g., trace buffer) that stores values of signals traced by the FPGA 130 during emulation (e.g., the states of DUT signals during emulation). In other embodiments, the emulator 110 includes other types of configurable logic circuits instead of FPGAs 130. In other embodiments, the emulator 110 includes one or more trace memories 150 separate from the FPGAs 130, where the one or more trace memories 150 can be used by multiple FPGAs 130 for storing data. The trace memories 150 also may be referenced as a "CPU log" or a "monitor". In other embodiments, the emulator 110 includes a mix of FPGA 130 or other configurable circuits and a mix of memories located in the components or separated from them, in order to achieve an optimal trace system. In another embodiment, the emulator 110 does not contain memories dedicated to trace, and uses memories that could be used to model the design, or stream the traced data directly over the interface 115. The emulator 110 may transmit values of traced signals stored in one or more trace memories 150 to the host system 120, after the emulation is finished or during the emulation. The emulator 110 may also transmit values of traced signals stored in one or more trace memories responsive to receiving a request from the host system 120 or prior to receiving a request from the host system 120. The values of the traced signals transmitted to the host system 120 by the emulator 110 can span one or more time frames, where each time frame includes multiple DUT clock cycles. In one or more embodiments, the FPGA 130 may be omitted or replaced with other types of reconfigurable circuits.

For a DUT that is to be emulated, the emulator 110 receives from the host system 120 through the interface 115 one or more binary files including a description of the DUT (e.g., a mapping of a gate level or a hardware description language (HDL) level description of the DUT). The binary files describe partitions of the DUT created by the host system 120 and a mapping of each partition to an FPGA 130. Based on the binary files, the emulator 110 configures each FPGA 130 to emulate the partition of the DUT mapped (assigned) to it and to trace certain signals in its respective partition. The FPGAs 130 collectively emulate the DUT. The values of signals traced by an FPGA 130 during emulation are temporarily stored by the FPGA 130 in its trace memory 150 before being transferred to the host system 120 through the interface 115. These signals as described below are used for generating additional information and/or processing the results of the emulation of the DUT.

The host system 120 configures the emulator 110 to emulate a DUT. The host system 120 may be a single computer or a collection of multiple computers. In the embodiment where the host system 120 is comprised of multiple computers, the functions described herein as being performed by the host system 120 may be distributed among the multiple computers. The host system 120 may be indirectly connected to the emulator 110 through another device, computer or network.

The host system 120 receives from a user a description of a DUT to be emulated by the emulator 110. In one embodiment, the description of the DUT is in a type of HDL, such as register transfer language (RTL). The host system 120 creates a gate level netlist based on the HDL description of the DUT. The host system 120 uses the HDL or the gate level netlist to partition the DUT into multiple partitions. The host system 120 maps (assigns) each partition to one or more FPGAs 130 included in the emulator 110. Together the FPGAs 130 will emulate the DUT and trace certain signals of the DUT.

The host system 120 creates binary files, which include information to configure the FPGAs 130 based on the DUT and the mappings. A binary file may include, for example, a design description of one or more partitions (e.g., gate level or HDL description), mapping information (e.g., mappings of partitions), connection information (e.g., connections between components of the DUT and/or connections between FPGAs) and design constraints for the DUT.

The host system 120 transmits the binary files to the emulator 110 so that the emulator 110 can configure the FPGAs 130 to emulate their respective mapped partition. The host system 120 instructs the emulator 110 to emulate the DUT. Each FPGA 130 emulates its respective partition and stores values of signals traced during the emulation in its trace memory 150.

Further, the host system 120 receives verification settings indicating values of signals of the DUT that are needed for performing analysis or verification of the DUT. The verification settings may be, for example, a request from a user to trace certain signals of the DUT for debugging or testing the DUT. The verification settings may also include a state machine used for analyzing the performance of the DUT.

The verification settings may include a system C model, C/C++ model, program or scripts analyzing design emulation results.

In one embodiment, contents in the trace memory 150 are transmitted to the host system 120 by the emulator 110 through the interface 115, when the FPGAs 130 are not emulating the DUT. In another embodiment, the emulator 110 transmits to the host system 120 through the interface 115 the contents in the trace memory 150 while the FPGAs 130 are emulating the DUT, thereby generating and transmitting a stream of traced information over the interface 115 in parallel with the emulation of the DUT.

Figure 2:
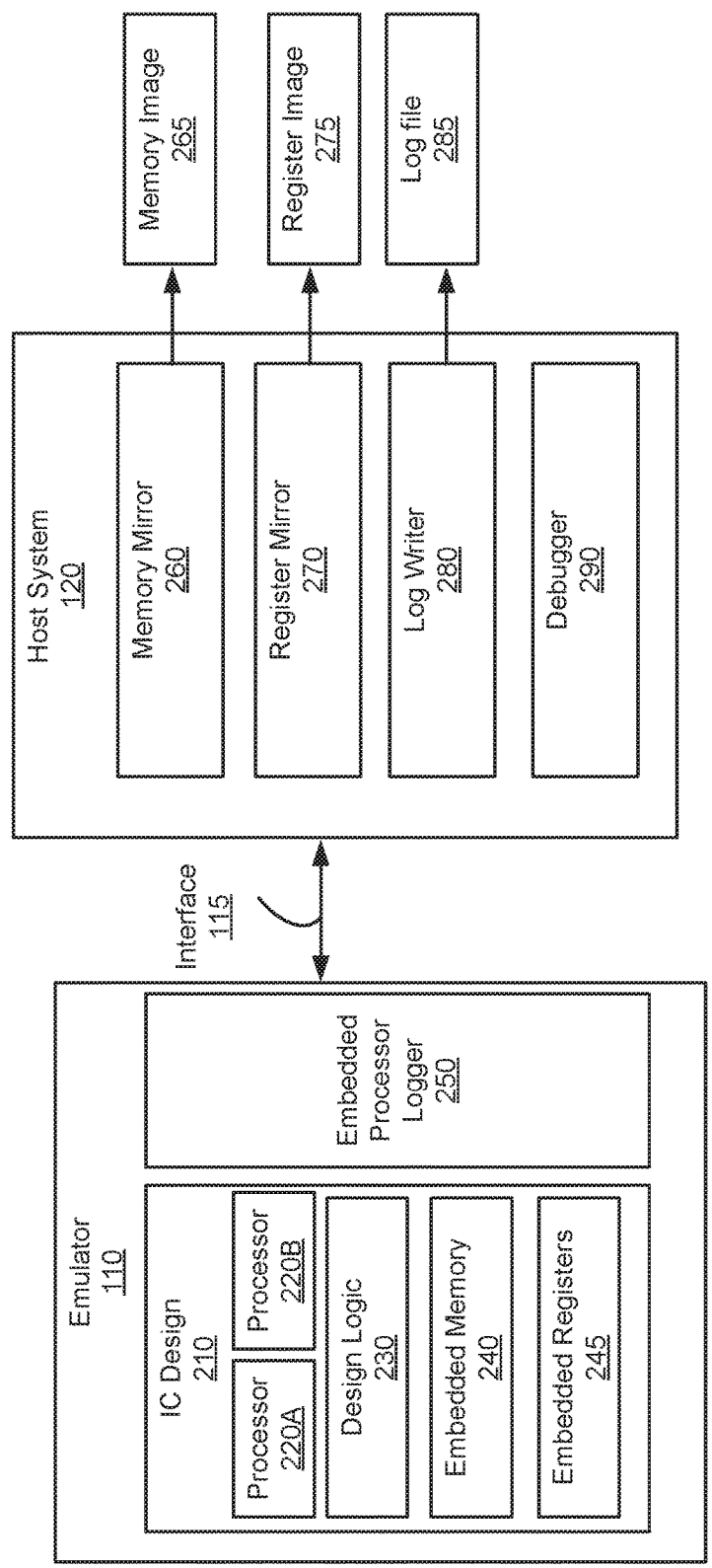
FIG. 2 illustrates a detailed diagram of the emulation environment, according to one embodiment.

FIG. 2 illustrates a detailed diagram of the emulation environment, according to one example embodiment.

In one example embodiment, the emulator 110 includes an integrated circuit (IC) design 210, and an embedded processor logger 250, as shown in FIG. 2. In one example, the IC design 210 further includes embedded processors 220A, 220B, design logic 230, embedded memory 240, and embedded registers 245, which are part of a user design. Each of these components operates together to emulate a DUT and generate emulation results. Emulation results include, for example, results of execution of individual embedded processor opcodes, calculating values and storing into embedded processor registers, loading and storing values into the DUT memory, execution of embedded software code, execution of BIOS or boot code, execution of operating system code such as a Linux boot, execution of other operating systems, execution of user-level application code. Each of these components may be embodied as hardware, software, firmware, or a combination thereof.

The embedded processor 220 (herein also referred to as "an embedded processing unit 220") is a processing unit of a DUT. The embedded processor 220 receives design instructions to execute, and executes the received input instructions to generate values of the execution results of each embedded processor 220. The design instructions are instructions to be executed by the one or more embedded processors 220 for testing an operation of the DUT. For example, the design instructions include, "ADD", "Subtract", "Multiply", "Load", "Store", "Branch", and etc. The execution results include, for example, updating embedded processor registers, updating program counter and status-register values, and reading and writing from the embedded memory 240.

The design logic 230 includes one or more logic circuits that performs customer specific functions for the DUT, including multiple levels of memory-cache logic, interconnect, routing or other on-chip network logic, external protocols such as PCI-Express, USB, MIPI, Ethernet or other protocols, custom processing units such as graphics or packet processing algorithms. In one aspect, the design logic 230 operates in conjunction with the embedded processing for testing the operation of the DUT.

The embedded memory 240 may be a storage unit for storing memory values of the execution results of the embedded processor 220. The embedded memory 240 may be part of the IC design 210. The values stored by the embedded memory 240 include, for example, embedded-software variable values from a language such as C, C++ or other, temporary storage of any data required by the program using routines such as malloc( ) or other, stack and heap space as used by various languages, general memory storage as required by the embedded code executing on the embedded processor. Example of the memory values are provided in table 1 below:

TABLE 1

Example memory transaction

TIME=100 WRITE ADDR= 0x1000 DATA=0x12345678
TIME=200 WRITE ADDR=0x2000 DATA=0x02020202
TIME=20000 READ ADDR=0x1000 DATA= 0x12345678
TIME=30000 READ ADDR=0x2000 DATA=0x02020202

The embedded registers 245 are storage units for storing temporary values of execution results of the embedded processors 220. Generally, the registers 245 store a fewer number of words than the embedded memory 240. For example, the registers store less than 100 words, and the embedded memory 240 stores larger than 100 words. The content stored by the register 245 can be accessed faster than content stored by the embedded memory 240. Hence, the registers 245 store frequently accessed values, where the embedded memory 240 stores static or infrequently accessed values. Examples of register values are provided in table 2 below:

TABLE 2

Example register transaction

TIME=100 ADD R1, R2, R3 // R1 + R2 -> R3 : WRITE TO R3
TIME=110 ADD R3,R4,R5 // R3 + R4 -> R5 : READ FROM R3, WRITE TO R5

The embedded processor logger 250 is logic that captures or calculates the instruction trace from the embedded processor 220, and may include re-ordering logic to re-order the instruction trace into atomic-instruction-order in the case where the embedded processor 220 is a multiple-issue or out-of-order processor. The embedded processor logger 250 extracts the program counter value and any associated changes to the status register, processor registers and memory read/write transactions. In one aspect, the embedded logger may be configured to generate a stream of values indicative of the execution results based on the memory values (i.e., values of execution results of the embedded processors 220 stored at the embedded memory 240) and/or the register values (i.e., values of execution results of the embedded processors 220 stored at one or more registers (e.g., embedded register 245) of the DUT).

The host system 120 includes a memory mirror 260, a register mirror 270, a log writer 280, and a debugger 290 as shown in FIG. 2. Each of these components operates together to store values of the execution results of the embedded processor 220, and generates a log file. The host system 120 receives information from the emulator 110 and writes a log file to the file system. Each of these components may be embodied as hardware, software (including firmware), or a combination thereof. It is note that each of these components may be embodied as a software module.

This host system 120 may perform processing on the data received from the emulator 110 to optimize the size of the data written to disk (of the emulator 110 or the host system 120), for example by compressing the data. The host system 120 may also perform processing to re-order or otherwise calculate the atomic-instruction-order data values to reduce the processing involved by the embedded processor logger 250. The host system 120 may simply write the data received from the embedded processor logger 250 to disk directly.

The memory mirror 260 is a storage unit for storing memory values. A memory value herein refers to an address/data pair of content stored in the embedded memory 240.

This memory mirror may be implemented in various manners including a sparse memory model or other implementations. The size of the memory mirror 260 address space may match the embedded memory 240. At any point in time, the memory mirror 260 contains the memory value for any address and the memory mirror 260 will have the same values observable in the embedded memory 240 by the embedded processor 220. In one aspect, the memory mirror 260 receives the stream of value from the embedded processor logger 250, extracts the memory values, and stores the memory values.

The register mirror 270 is a storage unit for storing register values. A register value herein refers to a list of embedded processor registers (e.g., registers 245) or status registers with the associated current value. In one aspect, the register mirror 270 receives the stream of register values from the embedded processor logger 250, extracts the register values, and stores the register values.

The log writer 280 is a hardware or software module for generating a log file 285. A log file 285 herein refers to a list of the executed instructions and results from the embedded processor 220. The log-file 285 is a text or other format file that contains a time-based trace of the instructions executed on the embedded processors 220. This log file 285 includes a list of the design instructions executed by the embedded processors 220 and the execution results for recreating states of the embedded processors 220. In one example, the log file 285 includes a time-stamp, program counter, status-register values, embedded processor register values, and processor read/write transaction information. The log file 285 may optionally cache data and other information about the processor state.

In one embodiment, the host system 120 generates images for debugging the IC design 210. Specifically, the host system 120 generates a memory image 265, a register image 275, and a log file 285. The memory image 265 is the list of address/value pairs present in the memory model at a specific time. The register image 275 is the list of embedded processor status and embedded processor register values at a specific time.

In one embodiment, the system described in FIG. 2 can be executed with limited or no debug information saved to the disk during the execution, with the entire state of the emulator 110 saved to disk (of the emulator 110 or the host system 120) at user-specified intervals. In one aspect, the memory mirror 260 and the register mirror 270 are in operation during emulation, and the memory image 265 and register image 275 are saved with the emulator state (e.g., state of the embedded processor 220) at any user-defined periods. The emulator 110 can then be re-started from any of these saved states and re-execute the operations for a small time-slice. During this re-execution, the emulator 110 can have additional debug or logging features enabled, including the log writer 280.

The result of this re-execution is the generation of the log file 285 for the re-executed time slice. The combination of the saved memory image, saved register image and the generated logfile for the time-slice allows the user to perform post-process debug in the time-slide without requiring a log for the complete emulation execution from time '0'.

This mode can also be used without saving the emulator state. In one aspect, the memory mirror 260 and register mirror 270 are operational at all times during the emulation execution. At any point in time the host system 120 can save the memory image 265 and register image 275, then enable the log writer 280 to generate initial memory, initial register and log file 285 information for any time slice. The log writer 280 can then be disabled if needed and the process can be repeated for any additional time-slices during the emulation run.

The debugger 290 performs post-process debugging. In one aspect, the debugger 290 obtains information needed for debugging the IC design 210 from the outputs of the memory mirror 260, register mirror 270, and log writer 280, without having to process a potentially very large set of data. In one aspect, the debugger 290 analyzes program counter, status registers, processor registers, and memory read/write transactions from the outputs of the memory mirror 260, register mirror 270, and log writer 280 for a particular DUT clock cycle, and recreates states of one or more processors 220 for a different DUT clock cycle during which the emulation results may not be stored by the host system 120. In some embodiments, the debugger 290 may be omitted or implemented by a different computing machine.

Figure 3:
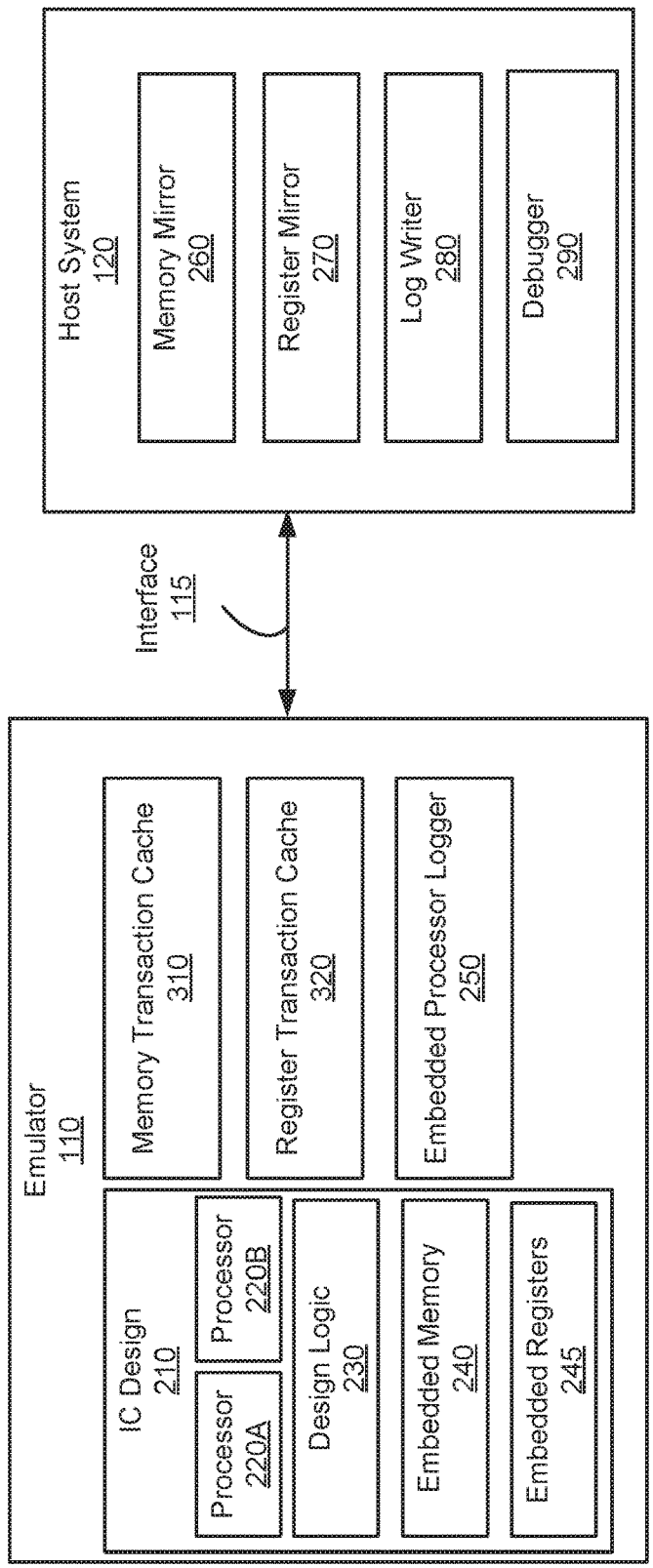
FIG. 3 illustrates a detailed diagram of the emulation environment, according to one embodiment.

FIG. 3 illustrates a detailed diagram of the emulation environment, according to one example embodiment.

In one embodiment, the emulator 110 includes the IC design 210, the embedded processor logger 250, a memory transaction cache 310, and a register transaction cache 320, as shown in FIG. 3. In one example, the IC design 210 and the embedded processor logger 250 are identical to the ones shown in FIG. 2, hence the detailed description thereof is omitted herein for the sake of brevity. The memory transaction cache 310 and the register transaction cache 320 are implemented in the emulator 110 to reduce the amount of data communicated between the emulator 110 and the host system 120 via the interface 115. Each of these components may be embodied as hardware, software, firmware, or a combination thereof.

The memory transaction cache 310 is a temporary hardware storage unit to maintain a list of address/data pairs of the embedded memory 240. This cache may be configured with various eviction or replacement mechanisms. At any time when an entry is evicted from the cache, the value is sent to the memory mirror 260 via the interface 115.

The register transaction cache 320 is a temporary hardware storage unit to maintain a list of register/data pairs of one or more registers of the DUT (e.g., IC design 210). This cache may be configured with various eviction or replacement mechanisms. At any time when an entry is evicted from the cache, the value is sent to the register mirror 270 via the interface 115.

Figure 4:
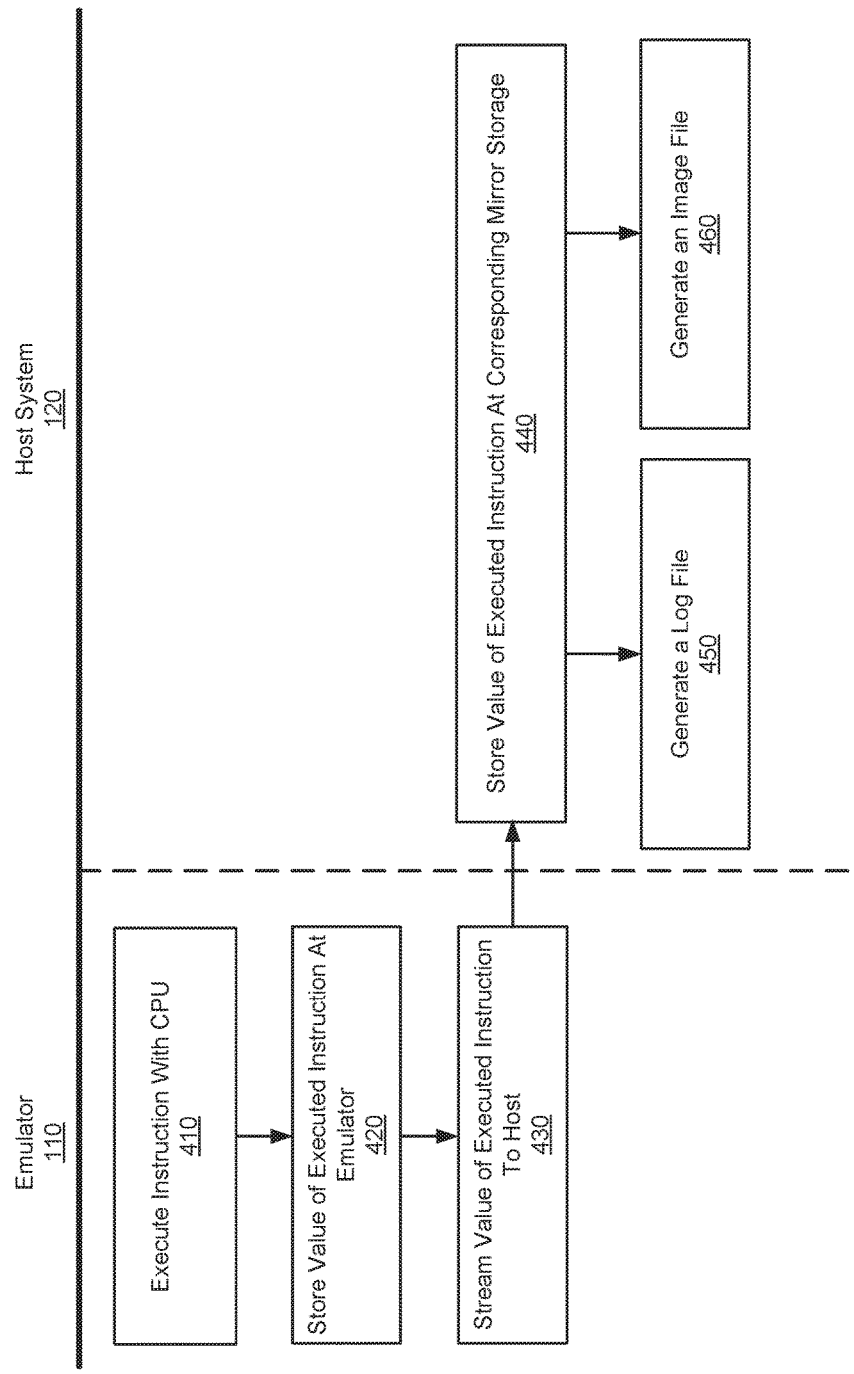
FIG. 4 is a flow chart illustrating the emulator and the host system emulating a design under test (DUT) and streaming embedded processor execution results to the host system, according to one embodiment.

FIG. 4 is a flow chart illustrating the emulator and the host system emulating a design under test (DUT) and streaming embedded processor execution results (or value of executed instruction) to the host system, according to one example embodiment. The emulator 110 and the host system 120 operate together to perform emulation and generate values of the execution results for debugging the DUT. Other embodiments can perform the steps of FIG. 4 in different orders. Moreover, other embodiments can include different and/or additional steps than the ones described here.

The emulator 110 executes 410 instructions through an embedded processor 220 of an IC design 210. The emulator 110 stores 420 a value of executed instruction at the emulator 110 (e.g., embedded memory 240 of the IC design 210). The emulator 110 streams 430 the value of the executed instruction to the host system 120.

The host system 120 receives the streamed value of the executed instruction, and stores 440 the value of the executed instruction in a corresponding mirror storage. For example, the host system 120 stores a memory value at the memory mirror 260, and a register value at the register mirror 270. In one aspect, the host system 120 generates 450 a log file based on the mirror value and the register value. The host system 120 may generate 460 an image file based on the log file at any time requested by the user. The image files from the memory mirror 260 or register mirror 270 can be stored in any format including a sparse-memory format.

Figure 7:
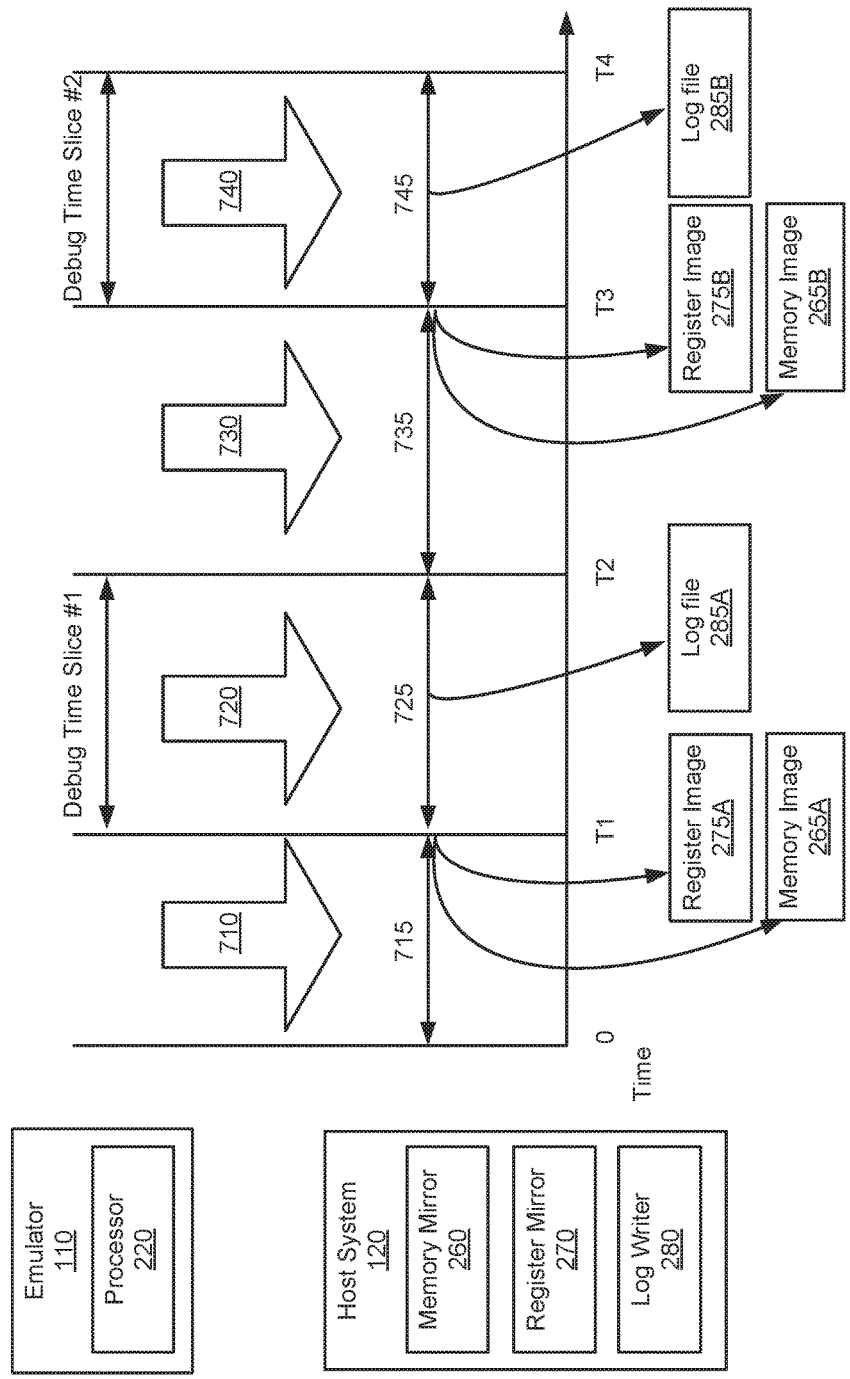
FIG. 7 illustrates an example operation of obtaining states of the embedded processor for a time slice, according to one embodiment.

FIG. 7 illustrates a timing diagram of an operation of the emulation environment for obtaining states of an embedded processor 220, according to one embodiment. In FIG. 7, the emulator 110 emulates an IC design 210 including an embedded processor 220, and generates a stream of values indicating the execution results of the embedded processor 220. The host system 120 receives the stream of values to restore states of the embedded processor 220.

Assuming for an example, the emulator 110 performs emulation from a time span between '0' and T4 encompassing a plurality of clock cycles of the DUT, where the time span is divided into four time slices: a time slice 715, a time slice 725, a time slice 735, and a time slice 745. Each time slice encompasses a corresponding portion of the clock cycles of the DUT. The user may desire to analyze emulation results (e.g., for debugging) for two time slices 725 and 745 only instead of analyzing the emulation results for the entire time span between '0' and T4. Note that the time slices displayed in the diagram may encompass different length of time. For example, time slice 715 may be for one billion cycles, and all other time slices may be for 10,000 cycles.

The emulator transmits the streams of values 710, 720, 730, 740 for time slices 715, 725, 735, 745, respectively. The host system 120 receives the streams of values 710, 720, 730, 740 from the emulator 110 during emulation, and stores memory values and register values at the memory mirror 260 and the register mirror 270 respectively during the emulation execution.

In one example, the contents of the memory mirror 260 and register mirror 270 are saved to image files 265A and 275A at the start of the first debug time slices at time T1 and into image files 265B and 275B at the start of the second debug time slice at time T3.

In one aspect, the log writer 280 is only enabled during the desired debug time-slices 725 and 745. For example, the log writer 280 is inactive during the time slice 715 and time slice 735 when debug is not desired. Note that the time when the log writer 280 is not active may be significantly longer than the time slices when the log writer 280 is active.

After the emulation is performed, the post-process debug solution has the memory contents at the start of a target time slice (e.g., the debug window or debug time slice) from image 265A, the register contents at the start of the target time slice (debug window) from image 275A and the CPU activity for the time slice in log file 285A. The post-process debug tool can obtain all debug information (e.g., information needed for debugging the IC design 210) from these 3 files without having to process a potentially very large set of data generated from time 0.

Figure 5:
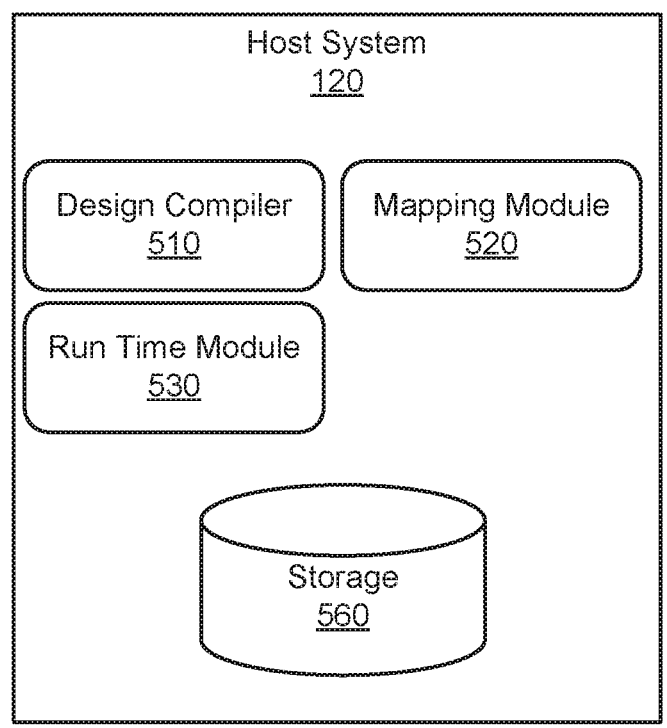
FIG. 5 is an example block diagram of the host system, according to one embodiment.

FIG. 5 is a block diagram illustrating the host system 120 in more detail, according to one embodiment. The host system 120 includes a design compiler 510, mapping module 520, run time module 530, and storage 560. Each of these components may be embodied as hardware, software, firmware, or a combination thereof. Additional configuration information for the host system 120 is illustrated in detail with respect to FIG. 6.

The design compiler 510 converts HDL of DUTs into gate level logic. For a DUT that is to be emulated, the design compiler 510 receives a description of the DUT in HDL (e.g., RTL or other level of abstraction). The design compiler 510 synthesizes the HDL of the DUT to create a gate level netlist with a description of the DUT in terms of gate level logic.

In one embodiment, the design compiler 510 identifies signals of the DUT to be traced by the emulator 110 during emulation of the DUT. In one embodiment, the identified signals do not include all signals in the DUT or all states of the DUT. In one embodiment, information is received from a user or from another system indicating the signals of the DUT that should be traced.

The mapping module 520 maps DUTs to FPGAs 130 of the emulator 110. After the design compiler 510 creates a gate level netlist, the mapping module 520 partitions the DUT at the gate level into a number of partitions using the netlist. In one embodiment, the mapping module 520 partitions the DUT by identifying one or more partitions of the DUT to be emulated based on signals needed to perform analysis of the DUT. The mapping module 520 maps each partition to a corresponding FPGA of the emulator 110. In one approach, the mapping module 520 performs the partitioning and mapping using one or more of the following: design rules, design constraints (e.g., timing or logic constraints), available resources in FPGA 130, limitations on trace memories 150, gates resulting from the HDL, HDL source code, user inputs, and information about the emulator 110.

The mapping module 520 generates one or more binary files to configure the FPGAs 130 to emulate their respective partition. In one embodiment, the mapping module 520 generates a binary file for each FPGA 130. The mapping module 520 stores the binary files in the storage 560. The mapping module 520 also stores signal information in the storage 560 indicating which signals are traced by each FPGA 130 based on the mappings.

The run time module 530 configures the emulator 110 for performing the emulation of a DUT. The run time module 530 transmits to the emulator 110 via interface 115 binary files stored in the storage 560 for the DUT to configure the FPGAs 130 of the emulator 110 to emulate the DUT. The run time module 530 instructs the emulator 110 to emulate the DUT. In one embodiment, prior to the start of the emulation or during the emulation of the DUT, the run time module 530 transmits to the emulator 110 input parameters and/or state machines to configure and control the emulation of the DUT.

In one embodiment, one or more functions of the host system 120 may be performed at another computer (e.g., a collection of dedicated computers or machines). For example, the design compiler 510 and the mapping module 520 may be included in another computer for compiling and partitioning a DUT.

Computing Machine Architecture

Figure 6:
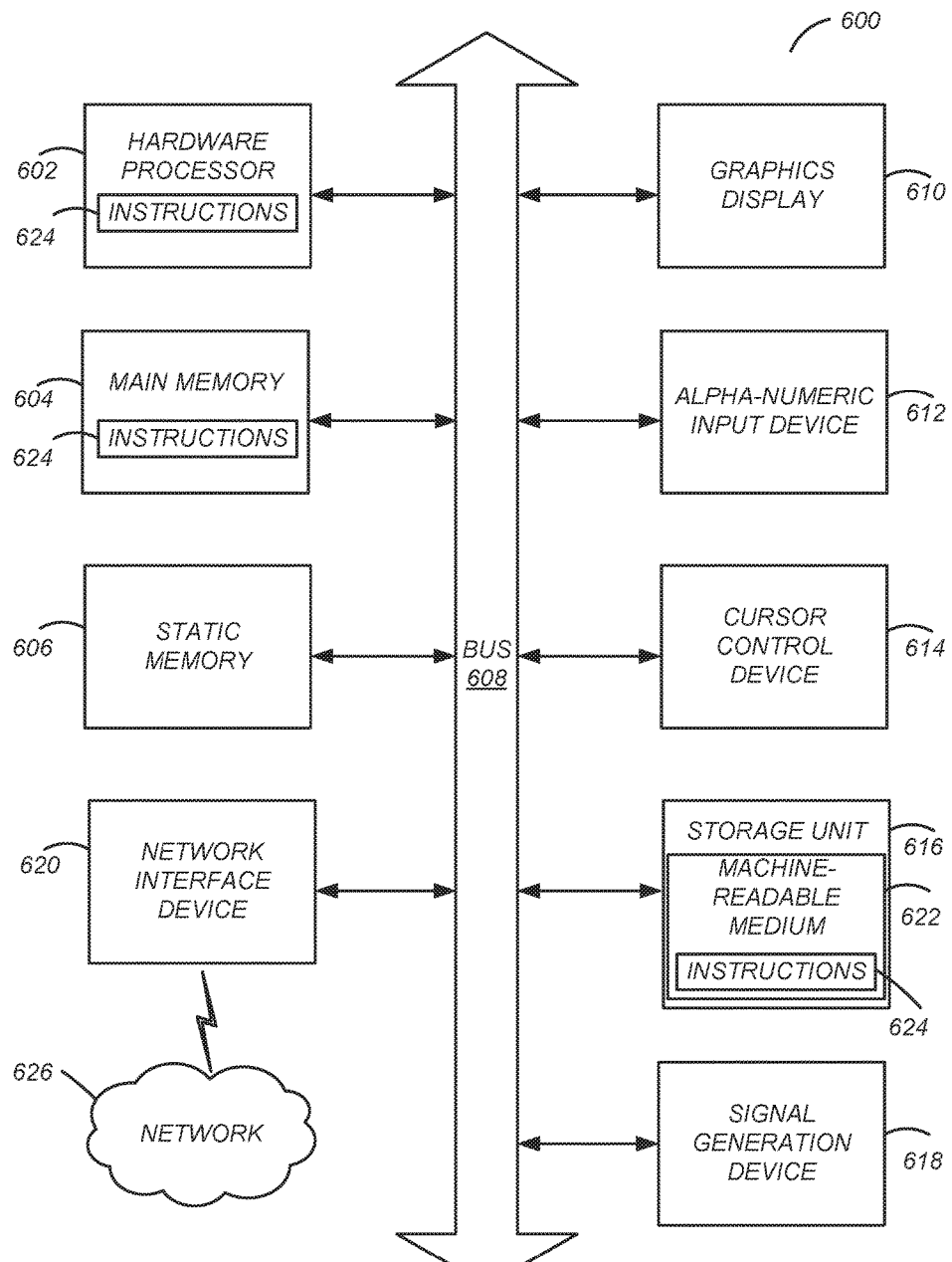
FIG. 6 illustrates one embodiment of components of an example machine able to read instructions from a machine-readable medium and execute them in a processor (or controller).

Turning now to FIG. 6, it is a block diagram illustrating components of an example machine able to read instructions from a machine-readable medium and execute them in one or more processors (or controller). Specifically, FIG. 6 shows a diagrammatic representation of a machine in the example form of a computer system 600 within which instructions 624 (e.g., software or program code) for causing the machine to perform (execute) any one or more of the methodologies described with FIGS. 1-4. Further, the machine can also be configured to operate the modules of FIG. 5. In addition, the computer system 600 may be used for one or more of the entities (e.g., host system 120, emulator 110) illustrated in the emulation environment 100 of FIG. 1.

The example computer system 600 includes a processor 602 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 604, and a static memory 606, which are configured to communicate with each other via a bus 608. The computer system 600 may further include graphics display unit 610 (e.g., a plasma display panel (PDP), a liquid crystal display (LCD), a projector, or a cathode ray tube (CRT)). The computer system 600 may also include alphanumeric input device 612 (e.g., a keyboard), a cursor control device 614 (e.g., a mouse, a trackball, a joystick, a motion sensor, or other pointing instrument), a storage unit 616, a signal generation device 618 (e.g., a speaker), and a network interface device 620, which also are configured to communicate via the bus 608. In addition, the computer system 600 may have a touch sensitive display.

The storage unit 616 includes a machine-readable medium 622 on which is stored instructions 624 (e.g., software) embodying any one or more of the methodologies or functions described herein. The instructions 624 (e.g., software) may also reside, completely or at least partially, within the main memory 604 or within the processor 602 (e.g., within a processor's cache memory) during execution thereof by the computer system 600, the main memory 604 and the processor 602 also constituting machine-readable media. The instructions 624 (e.g., software) may be transmitted or received over a network 626 via the network interface device 620.

While machine-readable medium 622 is shown in an example embodiment to be a single medium, the term "machine-readable medium" should be taken to include a single medium or multiple media (e.g., a centralized or distributed database, or associated caches and servers) able to store instructions (e.g., instructions 624). The term "machine-readable medium" shall also be taken to include any medium that is capable of storing instructions (e.g., instructions 624) for execution by the machine and that cause the machine to perform any one or more of the methodologies disclosed herein. The term "machine-readable medium" includes, but not be limited to, data repositories in the form of solid-state memories, optical media, and magnetic media.

As is known in the art, a computer system 600 can have different and/or other components than those shown in FIG. 6. In addition, the computer system 600 can lack certain illustrated components. For example, a computer system 600 acting as the emulator 110 may include one or more hardware processors 602, multiple storage units 616, a network interface device 620, and multiple configurable logic circuits (as described above with reference to FIG. 1), among other components, but may lack an alphanumeric input device 612 and a cursor control device 614. For another example, a computer system 600 acting as a host system 120 may include one or more hardware processors 602. The host system 120 with multiple processors 602 may perform multiple emulations in parallel on multiple threads, processes and/or machines. Subset of sections may be distributed either by a user or automatically by a software program to produce a set of signals based on an input set of signals through simulations performed in parallel.

Additional Configuration Considerations

In various embodiments, the log file 285 can be generated for the entire time, while emulator 110 is executing. Post process debug of the embedded-software code can then be performed using this complete log from time 0. However, this is inefficient as the log file 285 may be very large and the compute time to calculate all values for this large log file 285 may consume significant processing resources and time. Debug of a time-slice using a partial log, for example from 1-billion cycles starting time is not possible as all information about the memory values from time 0 to 1-billion cycles is not captured. Any memory values written during this 0 to 1-billion cycle window will be unknown, including embedded-software variables that have values assigned during the initial stages of the emulator 110 run for example. By obtaining the log file 285, states of the embedded processors 220 can be recreated in a short amount of time (e.g., a few hours).

Beneficially, the disclosed system and method can achieve debug of any time-slice during the emulation by keeping the current memory values inside a memory mirror 260 and the current register values inside a register mirror 270. The contents of the memory mirror 260 and register mirror 270 allow the log file 285 from any specific time to be created without requiring the complete log from time 0. For example, the memory image 265 and register image 275 are written at 1-billion cycles and the log writer 280 is then enabled for the next 10-million cycles to capture the log file 285 for the 10-million cycles. Post-process debug can then be performed on this small 10-million cycle time-window with full accuracy without the need to calculate and store the log file 285 for the full 1.01-billion cycles. The data (e.g., stream of values of the embedded processor 220 execution results) sent across the interface 115 can be further reduced by implementing a memory transaction cache 310 and register transaction cache 320 into the emulator 110. When entries are evicted from these caches the values can be transferred to the memory mirror 260 and register mirror 270.

It is noted that although the subject matter is described in the context of emulation environment for emulation of digital circuits and systems, the principles described may be applied to analysis of any digital electronic devices. Moreover, while the examples herein are in the context of an emulation environment including FPGAs, the principles described herein can apply to other analysis of hardware implementations of any digital logic circuitries or software simulation such as EDAs.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules (herein may be also referred to as "tools"), or mechanisms, for example, as illustrated in FIGS. 1-5. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. Hardware module implemented herein may be implemented in dedicated and permanently configured circuitry, or in temporarily configured circuitry (e.g., configured by software).

The various operations of example methods described herein may be performed, at least partially, by one or more processors, e.g., processor 602, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for performing the principles described herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:
1. A system comprising:
an emulator comprised of:
a reconfigurable circuit to implement a design under test (DUT) to be tested, the DUT including an embedded processing unit, the embedded processing unit to execute design instructions for testing an operation of the DUT, the design instructions executable by the embedded processing unit during clock cycles of the DUT, and an embedded processor logger, the embedded processor logger configured to generate a stream of values indicative of a portion of execution results, the portion of the execution results corresponding to a portion of the clock cycles; and a host system communicatively coupled to the emulator through an interface, the host system configured to generate a log file based on the stream of values, the log file including a list of the design instructions executed by the embedded processing unit and the portion of the execution results.

2. The system of claim 1, wherein the host system further comprises:

a debugger configured to generate one or more states of the embedded processing unit based on the log file, the one or more states corresponding to the clock cycles of the DUT.

3. The system of claim 2, wherein the log file does not include another portion of the execution results, said another portion of the execution results corresponding to another clock cycle of the DUT.

4. The system of claim 3, wherein the host is further configured to generate one or more states of the embedded processing unit based on the log file, the one or more states corresponding to said another clock cycle of the DUT.

5. The system of claim 1, wherein the emulator further comprises:

an embedded memory unit configured to store memory values of the portion of the execution results of the design instructions executed by the embedded processing unit, and one or more registers configured to store register values of the portion of the execution results of the design instructions executed by the embedded processing unit.

6. The system of claim 5, wherein the host system further comprises:

a memory mirror configured to extract the memory values from the stream of the values and to store the memory values, and a register mirror configured to extract the register values from the stream of the values and to store the register values.

7. The system of claim 5, wherein the register values include more frequently accessed data of the portion of the execution results than the memory values.

8. An emulator communicatively coupled to a host system, the emulator comprising:

a reconfigurable circuit to implement a design under test (DUT) to be tested, the DUT including an embedded processing unit, the embedded processing unit to execute design instructions for testing an operation of the DUT, the design instructions executable by the embedded processing unit during clock cycles of the DUT; and an embedded processor logger, the embedded processor logger configured to generate a stream of values indicative of a portion of execution results, the portion of the execution results corresponding to a portion of the clock cycles, wherein the host system is configured to generate a log file based on the stream of values, the log file including a list of the design instructions executed by the embedded processing unit and the portion of the execution results.

9. The emulator of claim 8, wherein the host system is further configured to generate one or more states of the embedded processing unit based on the log file, the one or more states corresponding to the clock cycles of the DUT.

10. The emulator of claim 8, further comprising a design logic including logic circuits to be tested, the logic circuits to operate in conjunction with the embedded processing unit for testing the operation of the DUT.

11. The emulator of claim 8, further comprising:

an embedded memory unit configured to store memory values of the portion of the execution results of the design instructions executed by the embedded processing unit; and one or more registers configured to store register values of the portion of the execution results of the design instructions executed by the embedded processing unit.

12. A non-transitory computer readable medium storing instructions, the instructions when executed by a host system cause the host system to:

configure an emulator to implement a design under test (DUT) on a reconfigurable circuit of the emulator, the DUT including an embedded processing unit and a memory unit;

configure the emulator to execute design instructions for testing an operation of the DUT through the embedded processing unit, the design instructions executable by the embedded processing unit during clock cycles of the DUT;

receive a stream of values, the values indicative of a portion of execution results of the design instructions executed by the embedded processing unit of the DUT, the values stored by the memory unit of the DUT;

store the stream of the values at one or more storage units of the host system; and generate a log file based on the stored stream of the values, the log file including a list of the design instructions executed by the embedded processing unit and the portion of the execution results.

13. The non-transitory computer readable medium of claim 12, further comprising instructions that when executed by the host system further cause the host system to:

generate one or more states of the embedded processing unit based on the log file, the one or more states corresponding to the clock cycles of the DUT.

14. The non-transitory computer readable medium of claim 12, wherein the log file does not include another portion of the execution results, said another portion of the execution results corresponding to another clock cycle of the DUT.

15. The non-transitory computer readable medium of claim 14, further comprising instructions that when executed by the host system further cause the host system to:

generate one or more states of the embedded processing unit based on the log file, the one or more states corresponding to said another clock cycle of the DUT.

16. The non-transitory computer readable medium of claim 12, wherein the emulator comprises:

an embedded memory unit configured to store memory values of the portion of the execution results of the design instructions executed by the embedded processing unit, and one or more registers configured to store register values of the portion of the execution results of the design instructions executed by the embedded processing unit.

17. The non-transitory computer readable medium of claim 16, further comprising instructions that when executed by the host system further cause the host system to:

extract the memory values from the stream of the values and to store the memory values, and extract the register values from the stream of the values and to store the register values.

18. The non-transitory computer readable medium of claim 17, wherein the register values include more frequently accessed data of the portion of the execution results than the memory values.

\* \* \* \* \*